United States Patent
Al-Imam et al.

(10) Patent No.: US 7,506,285 B2
(45) Date of Patent: Mar. 17, 2009

(54) MULTI-DIMENSIONAL ANALYSIS FOR PREDICTING RET MODEL ACCURACY

(76) Inventors: Mohamed Al-Imam, 11A Abd-Al-Aziz Street, Triumph Square, Heliopolis, Cairo 11361 (EG); Rami Fathy, 1210 Maxway, Fishkill, NY (US) 12524

(*) Notice: Subject to any disclaimer, the term of this patent is extended or adjusted under 35 U.S.C. 154(b) by 301 days.

(21) Appl. No.: 11/357,431

(22) Filed: Feb. 17, 2006

(65) Prior Publication Data
US 2007/0198964 A1 Aug. 23, 2007

(51) Int. Cl.
G06F 17/50 (2006.01)
(52) U.S. Cl. .................. 716/4; 716/11; 716/19
(58) Field of Classification Search .............. 716/4, 716/11, 19
See application file for complete search history.

(56) References Cited

U.S. PATENT DOCUMENTS

| | | | |
|---|---|---|---|
| 4,532,650 A | 7/1985 | Wihl et al. |
| 4,762,396 A | 8/1988 | Dumant et al. |
| 4,989,156 A | 1/1991 | Ikenaga |
| 5,502,654 A | 3/1996 | Sawahata |
| 5,655,110 A | 8/1997 | Krivokapic et al. |
| 5,699,447 A | 12/1997 | Alumot et al. |
| 5,723,233 A | 3/1998 | Garza et al. |
| 5,825,647 A | 10/1998 | Tsudaka |
| 5,879,844 A | 3/1999 | Yamamoto et al. |
| 5,991,006 A | 11/1999 | Tsudaka |
| 6,016,357 A | 1/2000 | Neary et al. |
| 6,049,660 A | 4/2000 | Ahn et al. |
| 6,056,785 A | 5/2000 | Chisaka |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |

(Continued)

FOREIGN PATENT DOCUMENTS

EP 1 424 595 6/2004

(Continued)

OTHER PUBLICATIONS

Cobb, N. "Flexible Sparse and Dense OPC Algorithms," *Proceedings of SPIE*, vol. 5853, *Photomask and Next-Generation Lithography Mask Technology XIII*, Bellingham, Washington, 2005, pp. 693-702.

(Continued)

*Primary Examiner*—Thuan Do
(74) *Attorney, Agent, or Firm*—Klarquist Sparkman, LLP

(57) ABSTRACT

A system and method for determining whether a desired integrated circuit layout can be accurately modeled from a resist model that is calibrated from a mask test pattern. In one embodiment, a chessboard graph is created having horizontal and vertical axes that are assigned two imaging parameters calculated from the test mask data and the desired integrated circuit layout data. Data on the horizontal and vertical axes of the chessboard graph are divided into a number of ranges or bins. The intersection of each bin on the horizontal and vertical axis is associated with a subgraph that plots the relation between two additional imaging parameters having values of the first two imaging parameters in the ranges of the intersecting bin.

31 Claims, 4 Drawing Sheets

U.S. PATENT DOCUMENTS

| | | |
|---|---|---|
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,317,859 B1 | 11/2001 | Papadopoulou |
| 6,370,679 B1 | 4/2002 | Chang et al. |
| 6,425,117 B1 | 7/2002 | Pasch et al. |
| 6,453,452 B1 | 9/2002 | Chang et al. |
| 6,453,457 B1 | 9/2002 | Pierrat et al. |
| 6,467,076 B1 | 10/2002 | Cobb |
| 6,499,003 B2 | 12/2002 | Jones et al. |
| 6,602,728 B1 | 8/2003 | Liebmann et al. |
| 6,643,616 B1 | 11/2003 | Granik et al. |
| 6,665,845 B1 | 12/2003 | Aingaran et al. |
| 6,728,946 B1 | 4/2004 | Schellenberg et al. |
| 6,792,159 B1 | 9/2004 | Aufrichtig et al. |
| 6,792,590 B1 | 9/2004 | Pierrat et al. |
| 6,815,129 B1 | 11/2004 | Bjorkholm et al. |
| 2002/0199157 A1 | 12/2002 | Cobb |
| 2003/0170551 A1 | 9/2003 | Futatsuya |
| 2003/0229881 A1* | 12/2003 | White et al. ............... 716/19 |
| 2004/0005089 A1 | 1/2004 | Robles et al. |
| 2004/0088149 A1 | 5/2004 | Cobb |
| 2005/0050490 A1 | 3/2005 | Futatsuya et al. |
| 2006/0036425 A1 | 2/2006 | Le Cocq et al. |

FOREIGN PATENT DOCUMENTS

| | | |
|---|---|---|
| JP | 09319067 A | 12/1997 |
| WO | WO 99/14638 A1 | 3/1999 |
| WO | WO 01/65315 A2 | 9/2001 |
| WO | WO 01/84237 | 11/2001 |
| WO | WO 03/042629 | 5/2003 |
| WO | WO 03/043075 | 5/2003 |

OTHER PUBLICATIONS

Cobb, N., and Y. Granik, "Model-Based OPC Using the MEEF Matrix," *Proceedings of SPIE*, vol. 4889: *22nd Annual BACUS Symposium on Photomask Technology*, Monterey, Calif., Sep. 30-Oct. 4, 2002, p. 147.

Cobb, N., and A. Zakhor, "Experimental Results on Optical Proximity Correction With Variable Threshold Resist Model," *Proceedings of SPIE*, vol. 3051: *Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE*, vol. 2240: *Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE*, vol. 2621: *15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE*, vol. 2197: *Symposium on Optical/Laser Microlithography VII*, San Jose, Calif., Mar. 2-4, 1994, pp. 348-360.

Cobb., N., et al., "Mathematical and CAD Framework for Proximity Correction," *Proceedings of SPIE*, vol. 2726: *Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE*, vol. 5130: *Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE*, vol. 4754: *Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE*, vol. 3334: *Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE*, vol. 2884: *16th Annual Symposium on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics* 37(12B):6686-6688, Dec. 1998.

K. Andrews, "Visualizing Information Structures: Aspects of Information Visualization," Professorial Thesis, Graz University of Technology, p. 57 (2002).

International Search Report, International Application No. PCT/US2007/002942, International filing date Feb. 2, 2007.

Written Opinion, International Application No. PCT/US2007/002942, International filing date Feb. 2, 2007.

\* cited by examiner

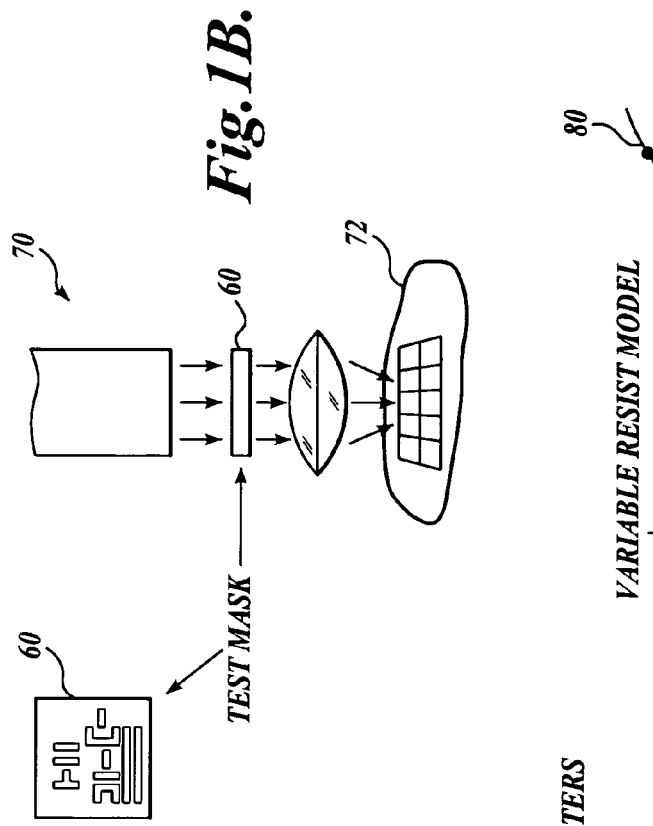
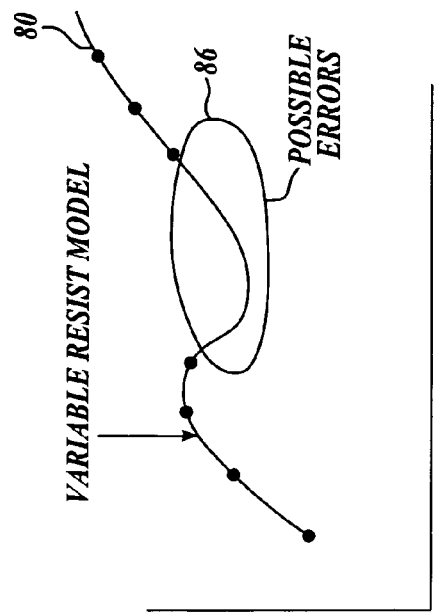
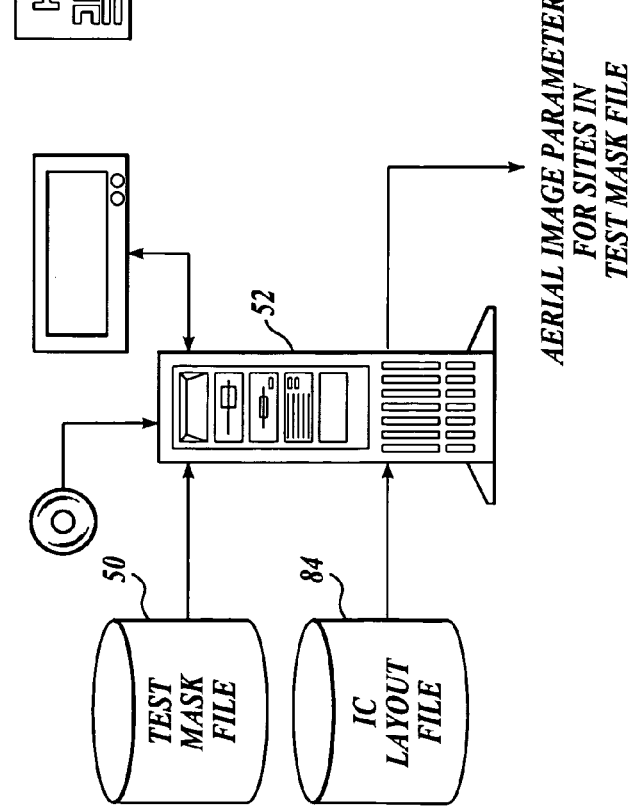
Fig.1A.
Fig.1B.
Fig.1C.

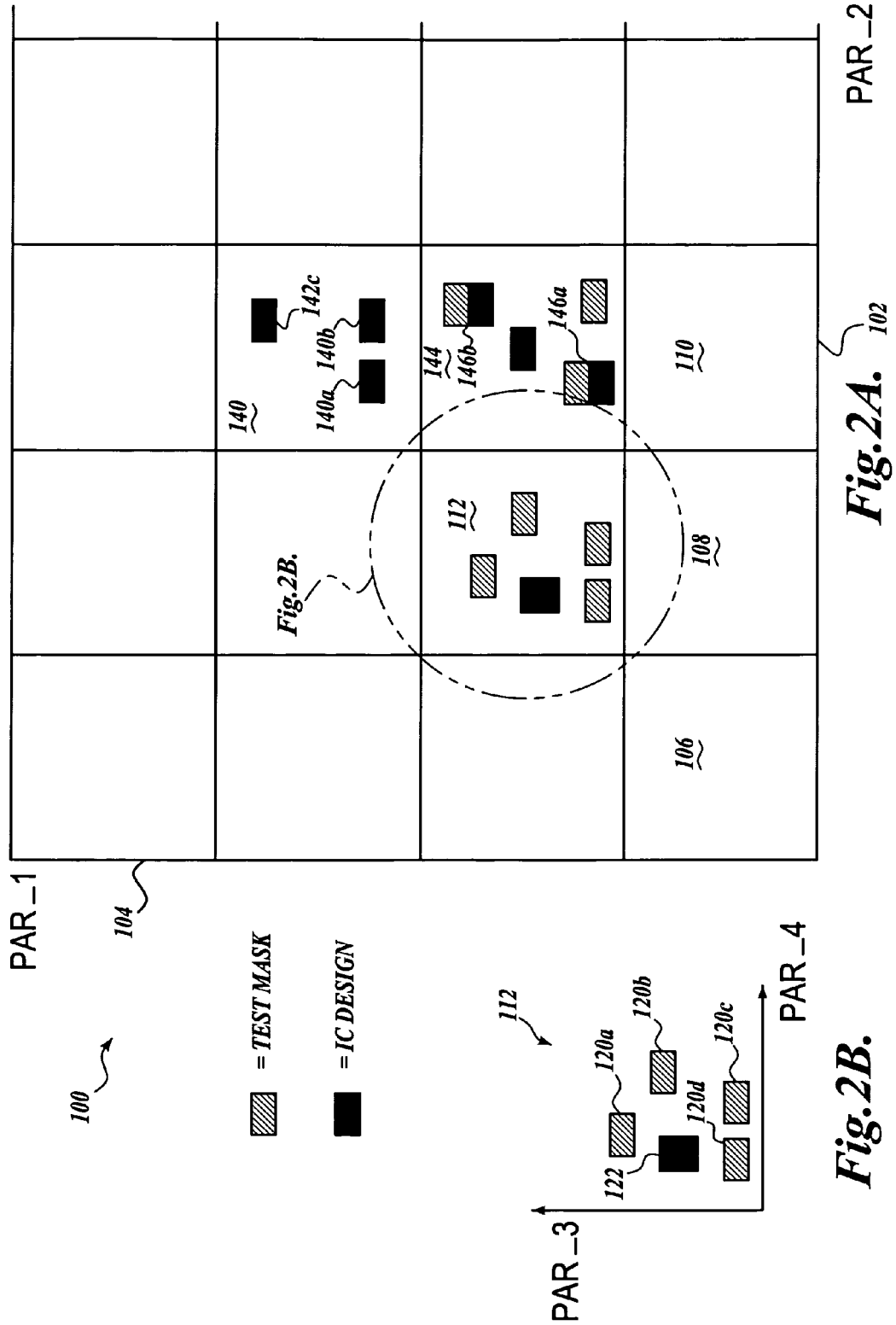

MULTI-DIMENSIONAL ANALYSIS FOR PREDICTING RET MODEL ACCURACY

FIELD OF THE INVENTION

The present invention relates to the accurate correction of integrated device layouts, and in particular to systems for calibrating models used in software for applying resolution enhancement techniques (RETs).

BACKGROUND OF THE INVENTION

As the number of components contained in an integrated circuit increases, such circuits become harder and harder to create with conventional photolithographic printing systems. For example, as the sizes of individual components defined by a mask or reticle become smaller than the wavelength of light used to expose the mask onto a semiconductor wafer, distortions can occur whereby the component pattern created on a wafer does not match the component pattern on the mask. To correct this, numerous resolution enhancement techniques such as optical and process correction (OPC) attempt to compensate for the expected distortions so that the pattern of features created on a wafer will match the desired pattern.

In order to accurately perform OPC and other resolution enhancement techniques, it is necessary to be able to predict how a pattern of features will be printed on a wafer. Therefore, it is necessary to have an accurate model of how the optics of a photolithographic system behave, as well as how the photosensitive chemicals, i.e., the resist layers of a wafer will react when exposed using a pattern of features on a mask or reticle. In general, the optics of a photolithographic printing system are independent of the particular circuit pattern to be created on a wafer, and the basic principles of optical modeling techniques have been well established for over a century. Therefore, models can be developed that simulate the optical behavior with a high degree of accuracy. However, the behavior of the photoresist or other processing steps can vary, depending on the particular pattern features that are to be created on a wafer. Therefore, to simulate the resist behavior accurately, it is necessary to calibrate a resist model using a test pattern that represents features similar to the integrated circuit pattern to be created. In the past, it has been difficult to ensure that the test mask pattern accurately represents all the typical features in the integrated circuit to be printed with the calibrated resist model. Therefore, there is a need for a system that allows a user to determine if a test mask pattern will provide an adequate resist model calibration for a desired integrated circuit layout.

SUMMARY

To address the problems discussed above, the present invention is a system for determining whether a process model, such as a resist model, can be accurately calibrated from a particular test pattern to predict the printing behavior of a desired layout. To verify the calibration, data for a test pattern defining a number of polygons to be printed on a test mask is received by computer system. Edges of the polygons in the test pattern data are divided into a number of edge fragments and simulation sites are associated with the edge fragments. A number of imaging parameters are calculated at each of the simulation sites, and prepared in a multi-dimensional database The same imaging parameters are then calculated with data for all or a portion of a desired layout, and also prepared in a multi-dimensional database. A display is then created from these databases that shows the combinations of imaging parameters that occur in the test pattern and those that occur in the desired layout.

In one embodiment, the display of the imaging parameters calculated for the test pattern and the desired layout is made on a graph of graphs such as a grid of evenly spaced squares, sometimes called a chessboard graph. The chessboard graph has a main graph with a horizontal and a vertical axis and a number of subgraphs contained therein. The horizontal and vertical axes of the main graph are defined as ranges of a first and second imaging parameter, respectively. Associated with each range on the vertical and the horizontal axis is a subgraph that plots a third and fourth imaging parameter that have values of first and second imaging parameters in the range of the subgraph. In this manner, the four-dimensional databases of results for the test pattern and the desired layout can be analyzed and compared using a two-dimensional display.

The present invention is not limited to comparing imaging parameters calculated from a desired layout and a test pattern, but can be used to plot any four-dimensional or five-dimensional data on a two-dimensional graph or image.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. (1A, 1B, 1C) illustrate a suitable computer system for calibrating a resist model from a test mask pattern in accordance with an embodiment of the present invention;

Figure 3:
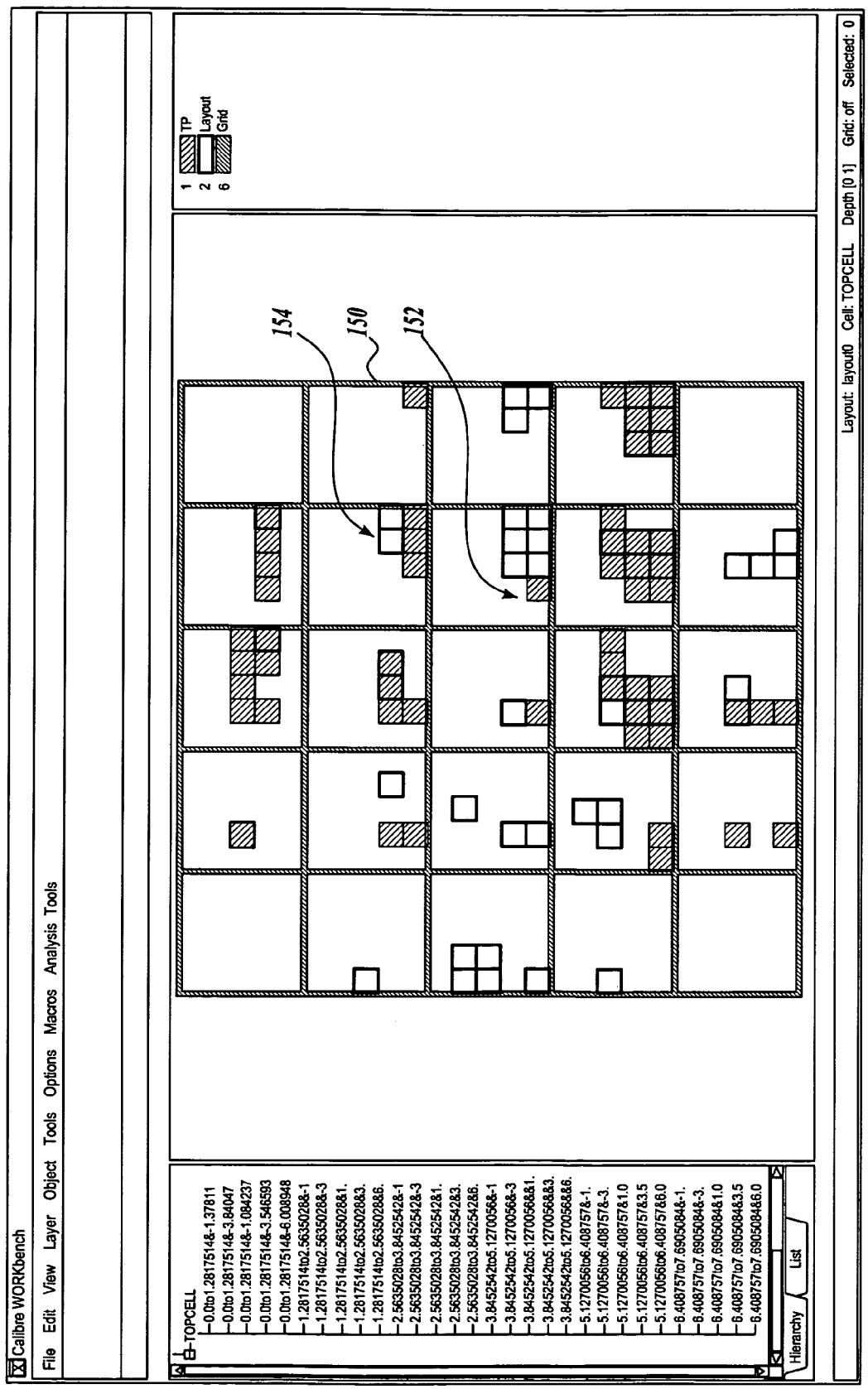
Figure 4:
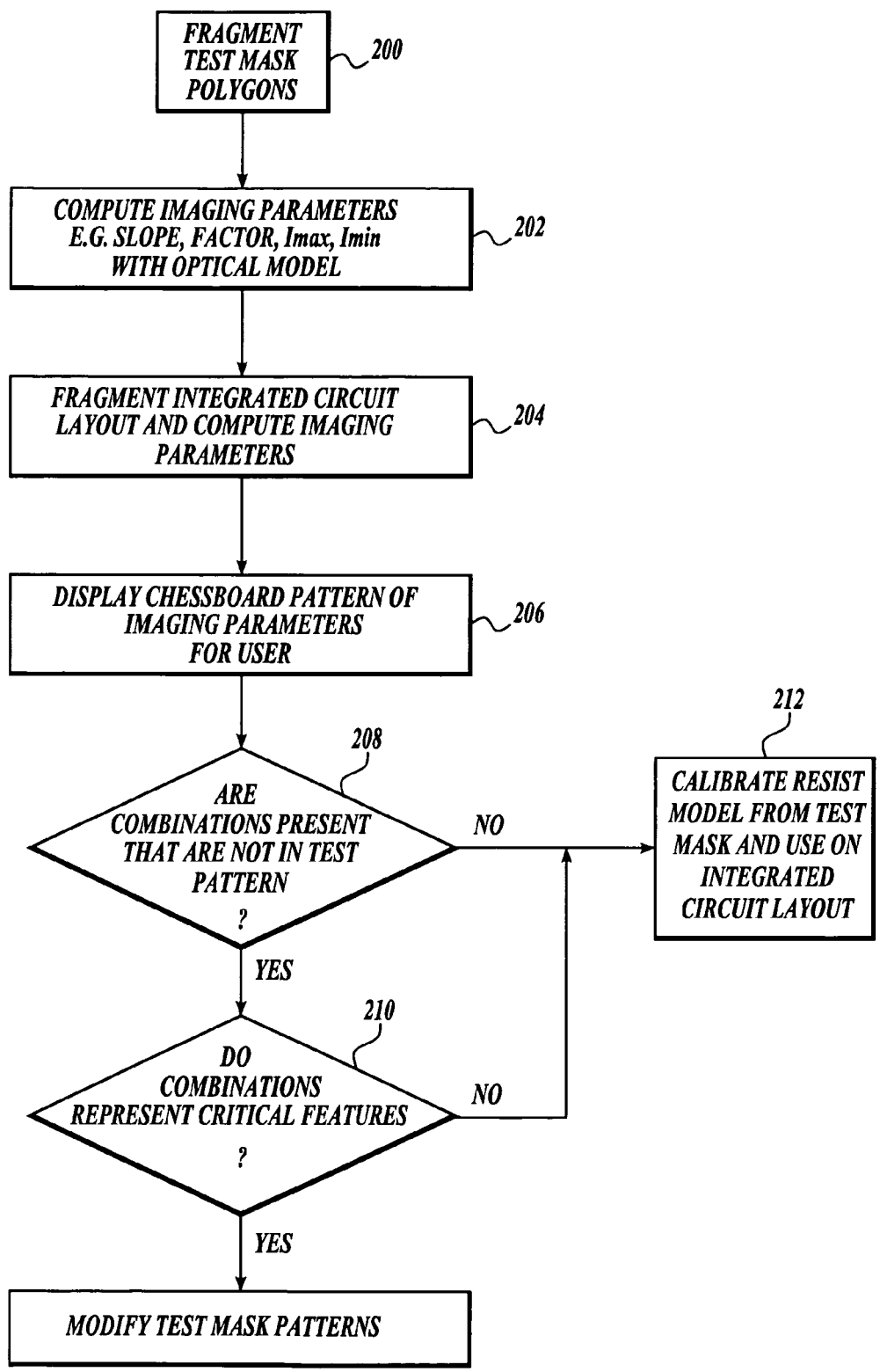

FIG. (2A, 2B) illustrate a simplified chessboard graph displaying combinations of imaging parameters in accordance with one embodiment of the present invention;

FIG. 3 illustrates an actual chessboard graph that compares imaging parameters calculated from data for a test mask pattern and from data for a desired integrated circuit layout in accordance with an embodiment of the present invention; and FIG. 4 illustrates a series of process steps performed by one embodiment of the present invention to determine if a resist model can be calibrated to print a desired integrated circuit layout with a test mask pattern.

DETAILED DESCRIPTION

As indicated above, the present invention is a method and apparatus for determining whether a test mask pattern provides enough information to accurately calibrate a resist model for use in predicting the printing of a desired integrated circuit layout. In another embodiment, the invention adds data for one or more additional structures to be included in the test mask in order to provide additional information and increase the accuracy of the calibrated model.

Although the present invention is described with respect to creating integrated circuits, it will be appreciated that the present invention is useful in predicting the printing behavior of any structures that are created with a photolithographic process, including integrated circuits, micro-electromechanical machines (MEMS), recording heads for disc drives, etc. If will also be appreciated that although the present invention is useful in predicting the behavior of photoresists under optical exposure, it can also be applied to electron beam lithography, X-ray lithography, extreme ultraviolet (EUV) lithography, plasma etching and other patterning techniques in which models require calibration.

FIG. 1 illustrates one suitable system for printing an integrated circuit layout on a semiconductor wafer. As indicated above, with any photolithographic manufacturing process that produces extremely small objects on a wafer, it is generally advisable to perform one or more resolution enhancement techniques (RET) to compensate for expected process distortions. One RET is optical and process correction (OPC) that compensates for bridging, widening, shortening, thickness variations, or other optical distortions that occur when a pattern on a mask or reticle is exposed onto a semiconductor wafer that is coated with a photo-sensitive resist material. OPC attempts to precompensate for the expected optical distortions by moving the edges of the features to be created either inwards or outwards, or by adding features such as hammerheads, serifs, subresolution assist features (SRAFs), etc., to the features in the layout such that it will print as desired.

In order to know how far an edge should be moved or to determine the size and placement of the assist features, hammerheads etc. it is necessary to model how a desired pattern will be printed on a semiconductor wafer. Because the behavior of the resist material on the wafer is dependent upon the pattern of objects to be created, a test mask 60 may be used to calibrate a resist model. The data for the test mask pattern 50 is stored in a database using a layout description language such as GDS-II or OASIS™. Data for the test mask pattern 50 is typically defined as a series of vertices that define corresponding polygons. The data from the test mask pattern 50 is read by a computer system 52 that divides the longer edges of the polygons into one or more edge fragments. A simulation site is then associated with one or more of the edges/edge fragments. The simulations sites are locations in which a number of aerial image parameters are simulated by the computer system 52.

The test mask 60 is then created from the test mask pattern data. The test mask 60 is used in a photolithographic printing system 70 to print a test pattern of features onto a semiconductor wafer 72. The semiconductor wafer is analyzed with precise measurement equipment such as a scanning electron microscope (SEM), and the edge placement errors (EPE) for each of the edges of the features created by the test mask pattern are determined. Given the aerial image parameters calculated for each of the simulation sites and the edge placement errors measured at the corresponding locations on the wafer test pattern, a resist model 80 is calibrated according to methods known to those of ordinary skill in the art. One such model is the variable threshold resist model (VTR). Once the resist model has been calibrated, it can be used to predict the printing of a desired integrated circuit layout or other device layout stored in a desired layout file 84.

As indicated above, there is always some possibility that an integrated circuit layout will not print as anticipated due to insufficient or incorrect data in the test mask so that the resist model cannot be accurately calibrated to predict the printing of particular structures defined by the integrated circuit layout file 84. As shown in FIG. 1, the resist model 80 is calibrated, given a number of known EPE reference points measured from the wafer test pattern and corresponding imaging parameters calculated by the computer 52. However, there exist possible regions of error 86, whereby the resist model has not been calibrated based on actual data. If the desired integrated circuit layout includes features that produce imaging parameters in this region, it is possible that the resist model will not accurately predict how the features will be printed. Therefore, errors in the resulting integrated circuit may occur. If the circuit features that produce the imaging parameters in the area 86 are features that are critical to the operation of the integrated circuit, the circuit may fail unexpectedly.

In the past, if a circuit unexpectedly failed, a laborious analysis would be undertaken to determine what features of the circuit were failing and whether the test mask pattern had included these types of features. If the test mask data did not define corresponding features, a new test mask would be constructed and the process of calibrating the resist model would be repeated.

To improve the accuracy of resist model calibration and to speed the calibration process, the present invention is a technique for allowing a user or computer system to easily determine if a resist model can be accurately calibrated to predict the printing behavior of a desired integrated circuit layout from a given test mask layout.

As shown in FIG. 2, a chessboard graph 100 produced in accordance with one embodiment of the present invention, illustrates combinations of imaging parameters calculated from the test mask data and combinations of imaging parameters calculated from a desired integrated circuit layout.

The chessboard graph 100 has a main graph with a horizontal axis 102 and a vertical axis 104. The horizontal and vertical axes are each assigned a parameter of the number of imaging parameters calculated. In one embodiment of the invention, the horizontal and vertical axes are divided into bins that contain ranges of the expected values that the imaging parameters can have. In the embodiment shown, the vertical axis of the graph 100 plots values of an imaging parameter (par-1), while the horizontal axis plots values of a second imaging parameter (par-2).

Each combination of bins defined in the horizontal and vertical axes of the main graph is associated with a corresponding subgraph 106, 108, 110, 112, etc. Each of the subgraphs contains a two-dimensional plot of two additional imaging parameters (par-3 and par-4) that have values of the first and second imaging parameters that fall within the range of a particular bin. In the example shown, a subgraph, for example, subgraph 112, plots a number of data points 120a-120d calculated from the test mask data. In addition, the subgraph 112 includes a data point 122 that is calculated from the desired integrated circuit layout.

By looking at the subgraph 112 in the chessboard graph 100, a user can quickly determine that a resist model will likely be accurately calibrated to predict the printing of the one or more features that produce the imaging parameters represented by the data point 122. However, the chessboard graph 100 also includes a subgraph 140 that includes numerous data points 142a, 142b, 142c that are calculated from features in the desired integrated circuit layout, but for which no corresponding data points are produced by features in the test mask pattern. Therefore, there is a chance that the features that produce this combination of imaging parameters may not be accurately modeled by a resist model that is calibrated with data from the test mask pattern.

As can be seen, the illustrated subgraphs contain varying levels of overlap between the imaging parameters calculated from the test mask data and from the desired integrated circuit layout data. For example, in the subgraph 112, there are four data points 120a-120d calculated from the test mask data and one data point 122 calculated from the desired integrated circuit layout data. The data point 122 does not overlap with any of the data points 120a-120d. In the subgraph 140, there are data points calculated from the desired integrated circuit layout data but no data points calculated from the test mask data. In a subgraph 144, there are data points 146a, 146b calculated from the test mask data and from the desired integrated circuit layout that overlap.

For some applications, it may be sufficient to assume that, if a subgraph contains data points obtained from both the test mask data and from the desired integrated circuit layout, then a resist model can be accurately calibrated for the features that produce the data. However, for critical features, it may be desirable to calculate the difference between the data points in one or more subgraphs and compare that to a predetermined minimum to determine if the test mask data is sufficiently close to the desired integrated circuit layout data to accurately calibrate the resist model.

FIG. 3 illustrates an actual chessboard graph 150 of the type shown in FIG. 2. As can be seen, the data in the graph includes a number of data points 152 (gray) that represent imaging parameters calculated from the test mask data and a number of data points 154 (white) that represent imaging parameters calculated from the desired integrated circuit layout. By comparing the presence and/or overlap of the data points calculated from the test mask data and from the desired integrated circuit layout data in each of the subgraphs, the user can quickly determine whether the test mask is likely to accurately calibrate the resist model for use in simulating the printing of the desired integrated circuit layout.

If there are subgraphs within the chessboard graph 150 for which one or more data points are present that are produced by the desired integrated circuit layout data but for which there are no corresponding data points produced from the test mask data, it is possible to add additional data to the test mask data that will produce the corresponding imaging parameters. In some instances, it may be desirable to mark or flag critical structures within a desired integrated circuit layout by tagging or the like. Imaging parameters produced from these circuit elements can be highlighted in the chessboard graph. For example, the data points that correspond to critical circuit elements can be shown in a highlighted color or as a blinking light or other visual cue that will draw attention by a user. Therefore, the user can quickly determine whether the structures that may cause a catastrophic failure if not correctly manufactured in the integrated circuit are likely to be modeled accurately by a resist model that is calibrated by data in the test pattern.

FIG. 4 illustrates a series of steps performed by one embodiment of the present invention to allow a user to determine whether a resist model calibrated from a test pattern is likely to accurately predict the printing of a desired layout pattern. Beginning at 200, a computer reads data for a test mask pattern or portion thereof from a test mask pattern file and the fragments the polygons defined by the test mask pattern data into one or more edge fragments. As will be appreciated, not all edges of the polygons in the test pattern need to be fragmented. Typically, only those edges that are longer than a predefined maximum are fragmented. In addition, fragmentation end points may be added to polygons at certain locations such as at line ends or at corners, etc. The computer assigns simulation sites to one or more of the edge fragments and computes the imaging parameters at each of the simulation sites at 202.

In one embodiment of the invention, the imaging parameters calculated include the maximum image intensity (Imax) and the minimum image intensity (Imin) at the various sample points of the simulation sites. In addition, the slope of the image intensity along the site direction i.e. in a direction perpendicular to the edge fragment) and parameter called "factor," which corresponds to the curvature of the image intensity in a direction parallel to the edge fragment are calculated. In one embodiment, the imaging parameter "factor" is computed as the second derivative of the image intensity in a direction parallel to the edge fragment.

At 204, the corresponding process steps are performed on the data for the desired integrated circuit layout. That is, the edges of the polygons in the desired integrated circuit layout data are fragmented into a number of edge fragments, and simulation sites are associated with one or more of the edge fragments. Imaging parameters are then calculated at one or more of the simulation sites.

At 206, a chessboard graph of imaging parameters such as that shown in FIGS. 2 and 3 is displayed for the user. In one embodiment, the main graph has a vertical axis that is assigned an imaging parameter such as Imax, and the horizontal axis is assigned another imaging parameter such as Imin. The vertical axis is divided into a number of equal or non-equal bins having a range of Imax values. Similarly, the horizontal axis is divided into a number of equal or non-equal bins having a range of Imin values. Each combination of bins in the main graph has a corresponding subgraph in which the remaining two imaging parameters are plotted against each other. For example, if a subgraph is defined for the intersection of bins 0<Imax<0.1 and 0<Imin<0.1, then the subgraph plots the imaging parameters slope and factor for those data sets that have Imin and Imax values in the ranges of the bins.

At 208, the user can readily determine whether there are combinations of imaging parameters that are calculated from the data for the desired integrated circuit layout that are not calculated from the data for the test pattern. If not, the resist model can be calibrated from the EPEs measured from a test mask and the computed image parameters at 212. The calibrated resist model can then be used to predict how the desired integrated circuit layout will print.

If the answer at 208 is YES, the user may determine whether the imaging parameter combinations that are present in the integrated circuit layout and not present in the imaging parameters generated from the test mask data represent critical features. If not, processing can return to 212 and the imaging parameters computed from the test mask data and the measured EPEs can be used to calibrate the resist model.

If the answer at 210 is YES, then the test pattern data can be modified to include structures that will produce the unrepresented or unmatched data points in the graph. In one embodiment, each of the data points plotted on the chessboard graph is mapped to a corresponding structure in the integrated circuit layout. The user may therefore click on or otherwise select a data point and the corresponding structures will be added to the test mask data.

As can be seen, the present invention provides a simple way for allowing a user to quickly evaluate whether a test mask pattern is likely to accurately calibrate a resist model in order to predict the printing of a desired integrated circuit layout or other device. Although the present invention allows a user to manually make the comparison of the imaging parameters calculated from the test mask pattern data and the imaging parameters calculated from the desired integrated circuit layout data, it is also possible that a computer could be programmed to perform the comparison. A computer can be programmed to analyze each subgraph within the chessboard graph for overlapping or adjacent data points in order to determine whether there exists combinations of imaging parameters produced from the integrated circuit layout data that are not generated from the test mask data. Furthermore, a computer can compare the imaging parameters calculated for critical features in an integrated circuit layout and determine whether the critical features are likely to be accurately predicted with a calibrated resist model by determining if there are corresponding imaging parameters calculated from data in the corresponding test mask pattern. For example, a computer can determine if a subgraphs contains data from either the test mask pattern or from the desired integrated circuit layout. The computer can also determine the difference in imaging parameters plotted in each subgraph. The computer can match data in a subgraph to the data in the desired integrated layout to determine whether the data represents a critical feature. Finally, the computer can change the display of any particular data point to indicate how many of those data points are calculated from either the test mask data from the desired integrated circuit layout data. For example, it may be desirable to color code data points depending on how many times the data is calculated.

In one embodiment of the invention, the chessboard graph shown in FIGS. 2 and 3 is calculated within a suite of verification and resolution enhancement tools such as the Calibre™ program produced by Mentor Graphics Corporation of Wilsonville, Oreg., the assignee of the present invention. In Calibre, layout data is stored in a number of data layers. To produce the graphs shown in FIGS. 2 and 3, one or more new cells are defined in a data layer. For each imaging parameter, the value of the imaging parameter due to each site in the design and test pattern layouts are compared to extract the maximum and the minimum values of the imaging parameter. The range for this imaging parameter is then calculated as ("max value"–"min value"), which is then divided into as many bins as appeals to the user. The number of bins into which the range is divided, controls the number of squares that will be produced in the graph for this specific imaging parameter.

For example, assume imaging parameter par-1 and imaging parameter par-2 are plotted on the major axes of the graph. If imaging parameter par-1 is divided into 10 bins imaging parameter par-2 is divided into 10 bins, then the graph will have a 10 by 10 squares grid or 100 subgraphs.

Each square is generated in a separate cell, which is placed under the top cell in the hierarchy of the layout. The name of the cell specifies the ranges of imaging parameters par-1 and par-2 that it spans. The cells are then referenced for placement in its proper position in the graph.

Associated with each square is a the number that controls the amount of sub-squares that are needed to fill the larger squares in the direction of the local axis that correspond to each imaging parameter par-3 or par-4.

By putting each square in a separate cell, the user can know the span of image parameters par-1 and par-2 by reading the cell name, and the distribution of the sub-squares inside the cell shows the user the distribution of imaging parameters par-3 and par-4 for this specific span for imaging parameters par-1 and par-2.

Data from test patterns is drawn in a layer, and data from the design layout is drawn in another layer.

Other tools of the Calibre layout viewer, allow a user to perform tasks such as zooming and layer display properties to zoom in and out as well as changing the display properties of different layers. This gives the user the ability to compare the aerial image properties extracted from both the test pattern and the design layout.

In one embodiment, a computer-readable media contains a sequence of instructions that when executed by the computer cause it to perform the process steps described above and shown in FIG. 4. The computer may be a stand alone or distributed computer system. Alternatively, the computer may transmit the test mask data and the desired integrated circuit layout data to a remote computer that performs the process steps.

Although the present invention is useful for displaying imaging parameters for photolithographic printing processes, it will be appreciated that the present invention is also useful for displaying any set of four variables in two dimensions. If color, shading or other variations are used to distinguish the data points as they are plotted, the present invention can plot five variables in two dimensions. It is also conceivable that additional sub-grids be added to the display, allowing even higher dimensional displays of information in two dimensions. It should be further noted that, although the illustrated graph of graphs is a chessboard type display in which the sub-graphs abut, other formats of displays in which the sub-graphs are arranged with additional borders or white space between them may also offer a two dimensional display of multidimensional data. Also, although we have shown sub-graphs which are square, other sub-graph formats such as rectangles or trapezoids or even circles for polar coordinate representations may be more suitable for some applications.

Therefore, the present invention is not intended to be limited to its use only in determining whether a variable resist model can be accurately calibrated from a test mask pattern. For example, the present invention can be useful in determining if other models such as an etch model or a fill pattern for use in chemical-mechanical polishing (CMP) can be accurately calibrated from data gathered from a test mask pattern. Furthermore, the present invention may be useful in plotting medical, agricultural, military or statistical variables against each other in a human perceptible form such as a computer screen or on paper.

The embodiments of the invention in which exclusive property or privilege is claimed are defined as follows:

1. A computer-readable medium on which a sequence of executable instructions are stored that when executed by a computer system causes the computer system to:
    calculate a number of imaging parameters from data representing a test mask;
    calculate a number of imaging parameters from data representing a desired integrated circuit layout; and
    display the imaging parameters calculated from the test mask data and from the desired integrated circuit layout data on a two dimension graph so that it can be determined if there are one or more imaging parameters calculated from the desired integrated circuit layout data that are not present in the imaging parameters calculated from the test mask data.

2. The computer-readable medium of claim 1, wherein the display is created by:
    displaying a graph having a horizontal axis and a vertical axis that are grouped into ranges of a first and second imaging parameter, respectively; and
    creating a subgraph for each intersecting range of the imaging parameters defined by the horizontal and vertical axes of the graph, wherein the subgraph plots a relation between a third and fourth imaging parameter that have first and second imaging parameter values in the intersecting range.

3. The computer readable medium of claim 1, wherein the display is created by:
    creating a graph that plots a first and second imaging parameter grouped into ranges; and
    creating a number of subgraphs that plot a third and fourth imaging parameter having values of the first and second imaging parameters in the same range.

4. The computer-readable medium of claim 1, wherein the computer marks on the visual display the imaging parameters calculated from critical features in the desired integrated circuit layout.

5. The computer-readable medium of claim 1, wherein the sequence of executable instructions causes the computer system to analyze whether imaging parameters calculated from the desired integrated circuit layout data correspond to imaging parameters calculated from the test mask data.

6. The computer-readable medium of claim 1, wherein the sequence of executable instructions causes the computer system to add features to the test mask data that will produce the imaging parameters produced by the desired integrated circuit layout data but not produced by the original test mask data.

7. A method of calibrating a resist model for use in a photolithographic printing process comprising:
   calculating a number of imaging parameters from data representing a test mask;
   calculating a number of imaging parameters from data representing a desired integrated circuit layout; and
   displaying the imaging parameters calculated from the test mask data and from the desired integrated circuit layout data on a two dimension graph so that it can be determined if there are one or more imaging parameters calculated from the desired integrated circuit layout data that are not present in the imaging parameters calculated from the test mask data.

8. The method of claim 7, wherein the displaying is performed by:
   displaying a graph having a horizontal axis and a vertical axis that are grouped into ranges of a first and second imaging parameter, respectively; and
   creating a subgraph for each intersecting range of the imaging parameters defined by the horizontal and vertical axes of the graph, wherein the subgraph plots a relation between a third and fourth imaging parameter that have first and second imaging parameter values in the intersecting range.

9. The method of claim 7, further comprising marking on the visual display the imaging parameters calculated from critical features in the desired integrated circuit layout.

10. The method of claim 7, further comprising analyzing whether imaging parameters calculated from the desired integrated circuit layout data correspond to imaging parameters calculated from the test mask data.

11. The method of claim 7, further comprising adding data to the test mask data that will produce the imaging parameters produced by the desired integrated circuit layout data but not produced by the original test mask data.

12. The method of claim 7, wherein the displaying is performed by:
   creating a graph that plots a first and second imaging parameter grouped into ranges; and
   creating a number of subgraphs that plot a third and fourth imaging parameter having values of the first and second imaging parameters in the same range.

13. A computer programmed to perform a method of calibrating a resist model for use in a photolithographic printing process, the method comprising:
   calculating a number of imaging parameters from data representing a test mask;
   calculating a number of imaging parameters from data representing a desired integrated circuit layout; and
   displaying the imaging parameters calculated from the test mask data and from the desired integrated circuit layout data on a two dimensional graph so that it can be determined if there are one or more imaging parameters calculated from the desired integrated circuit layout data that are not present in the imaging parameters calculated from the test mask data.

14. A computer-readable medium on which a sequence of executable instructions are stored that when executed by a computer system causes the computer system to perform a method, the method comprising:
   displaying a first set of values corresponding to a first imaging parameter calculated from test mask data for use in calibrating a resist model and a second set of values corresponding to the first imaging parameter calculated from data representing a desired layout on a two dimensional plot so that values of the first imaging parameter calculated from the test mask data can be compared to values of the first imaging parameter calculated from the data representing the desired layout.

15. The computer-readable medium of claim 14, wherein the method further comprises:
   calculating the first set of values corresponding to the first imaging parameter by simulating an aerial image produced by a test mask represented by the test mask data; and
   calculating the second set of values corresponding to the first imaging parameter by simulating an aerial image associated with the desired layout.

16. The computer-readable medium of claim 14, wherein the method further comprises:
   displaying a first set of values corresponding to a second imaging parameter calculated from the test mask data and a second set of values corresponding to the second imaging parameter calculated from the data representing the desired layout on the two dimensional plot,
   wherein the displaying of the sets of values on the two dimensional plot is performed with the first imaging parameter plotted along a first axis and the second imaging parameter plotted along a second axis.

17. The computer-readable medium of claim 16, wherein the displaying of the sets of values comprises dividing the first and the second axes into a number of bins, each corresponding to a range of values of the first and the second imaging parameters.

18. The computer-readable medium of claim 17, wherein the method further comprises:
   displaying first sets of values corresponding to third and fourth imaging parameters calculated from the test mask data and second sets of values corresponding to the third and fourth imaging parameters calculated from the data representing the desired layout sets of values of the third and fourth imaging parameters on two dimensional subgraphs,
   wherein the subgraphs are displayed within the bins and wherein values for the third and fourth imaging parameters for each subgraph have values for the first and the second imaging parameters within the corresponding range of values for the respective bin.

19. The computer-readable medium of claim 14, wherein the method further comprises indicating whether values displayed in the two dimensional plot correspond to critical features.

20. The computer-readable medium of claim 14, wherein the method further comprises:
   calculating a difference between a value calculated from the test mask data and a value calculated from the data representing the desired layout; and comparing the difference to a predetermined threshold to estimate how well the test mask data will calibrate the resist model.

21. The computer-readable medium of claim 14, wherein the method further comprises:
   determining whether one or more of the values calculated from the data representing the desired layout correspond to values calculated from the test mask data; and
   modifying the test mask data based on the determination by defining new features to be represented by the test mask data, thereby generating modified test mask data.

22. The computer-readable medium of claim 21, wherein the method further comprises:
   calibrating the resist model using the modified test mask data; and
   performing an optical and process correction technique on the data representing the desired layout using the calibrated resist model.

23. A method, comprising:
   displaying a first set of values corresponding to a first imaging parameter calculated from test mask data for use in calibrating a resist model and a second set of values corresponding to the first imaging parameter calculated from data representing a desired layout on a two dimensional plot so that values of the first imaging parameter calculated from the test mask data can be compared to values of the first imaging parameter calculated from the data representing the desired layout.

24. The method of claim 23, further comprising:
   calculating the first set of values corresponding to the first imaging parameter by simulating an aerial image produced by a test mask represented by the test mask data; and
   calculating the second set of values corresponding to the first imaging parameter by simulating an aerial image associated with the desired layout.

25. The method of claim 23, further comprising:
   displaying a first set of values corresponding to a second imaging parameter calculated from the test mask data and a second set of values corresponding to the second imaging parameter calculated from the data representing the desired layout on the two dimensional plot,
   wherein the displaying of the sets of values on the two dimensional plot is performed with the first imaging parameter plotted along a first axis and the second imaging parameter plotted along a second axis.

26. The method of claim 25, wherein the displaying of the sets of values comprises dividing the first and the second axes into a number of bins, each corresponding to a range of values of the first and the second imaging parameters, and further comprising:
   displaying first sets of values corresponding to third and fourth imaging parameters calculated from the test mask data and second sets of values corresponding to the third and fourth imaging parameters calculated from the data representing the desired layout sets of values of the third and fourth imaging parameters on two dimensional subgraphs,
   wherein the subgraphs are displayed within the bins and wherein values for the third and fourth imaging parameters for each subgraph have values for the first and the second imaging parameters within the corresponding range of values for the respective bin.

27. The method of claim 23, further comprising indicating whether values displayed in the two dimensional plot correspond to critical features.

28. The method of claim 23, further comprising:
   calculating a difference between a value calculated from the test mask data and a value calculated from the data representing the desired layout; and
   comparing the difference to a predetermined threshold to estimate how well the test mask data will calibrate the resist model.

29. The method of claim 23, further comprising:
   determining whether one or more of the values calculated from the data representing the desired layout correspond to values calculated from the test mask data; and
   modifying the test mask data based on the determination by defining new features to be represented by the test mask data, thereby generating modified test mask data.

30. The method of claim 29, further comprising:
   calibrating the resist model using the modified test mask data; and
   performing an optical and process correction technique on the data representing the desired layout using the calibrated resist model.

31. The method of claim 29, further comprising producing a test mask using the modified test mask data.

* * * * *